United States Patent [19]

Chouan et al.

[11] Patent Number: 5,328,515
[45] Date of Patent: Jul. 12, 1994

[54] CHEMICAL TREATMENT PLASMA APPARATUS FOR FORMING A RIBBON-LIKE PLASMA

[75] Inventors: Yannick Chouan, Louannec; Michel Le Contellec, Lannion; François Morin, Lannion; Serge Saada, Lannion, all of France

[73] Assignee: France Telecom Etablissement Autonome de Droit Public, France

[21] Appl. No.: 57,055

[22] Filed: May 3, 1993

[30] Foreign Application Priority Data

May 7, 1992 [FR] France .................... 92 05629

[51] Int. Cl.⁵ .................. H01L 21/00; C23C 16/00
[52] U.S. Cl. ...................... 118/723 ME; 118/719; 118/715; 156/345
[58] Field of Search ............. 118/723 MW, 723 ME, 118/723 MR, 723 MA, 723 AN, 715, 719; 156/345; 204/298.38

[56] References Cited

U.S. PATENT DOCUMENTS

| | | |
|---|---|---|
| 4,939,424 | 7/1990 | Kieser et al. ............... 315/111.21 |
| 4,940,015 | 7/1990 | Kabashi et al. ........ 156/DIG. 68 X |
| 5,053,244 | 10/1991 | Kieser et al. |
| 5,074,245 | 12/1991 | Ota et al. ............... 118/723 MW X |
| 5,079,033 | 1/1992 | Schulz et al. ............. 118/723 MA |
| 5,110,437 | 5/1992 | Yamada et al. |
| 5,234,502 | 8/1993 | Mochizuki et al. .... 156/DIG. 68 X |

FOREIGN PATENT DOCUMENTS

| | | |
|---|---|---|
| 0279895 | 8/1988 | European Pat. Off. |
| 0398832 | 11/1990 | European Pat. Off. |
| 0422430 | 4/1991 | European Pat. Off. |

OTHER PUBLICATIONS

Patent Abstract of Japan, Appl. No. JP850103141, Publ. No. JP61260219.
Patent Abstract of Japan, Appl. No. JP880268746, Publ. No. JP2114530.
M. Geisler et al., J. Vac. Sci. Technol., A8 (2), Mar.-/Apr. 1990, pp. 908–915, "Elongated Microwave Electron Cyclotron Resonance Heating Plasma Source"
French Search Report, FR 9205629, FA 473921.

*Primary Examiner*—Brian E. Hearn
*Assistant Examiner*—Jonathan D. Baskin
*Attorney, Agent, or Firm*—Pearne, Gordon, McCoy & Granger

[57] ABSTRACT

The apparatus incorporates a h.f. source (2), a plasma enclosure (4) having gas supplies, a vacuum pump (50), elements for coupling the source to the plasma enclosure, which is of a non-radiating type and which is shaped like a rectangular parallelepiped with first and second dielectric material faces parallel to the direction of the magnetic field and a third face having a rectangular opening (14) parallel to said field for forming a ribbon-like plasma, a treatment enclosure containing a mobile sample holder (18) communicating via the opening with the plasma enclosure. The coupling means have two linear waveguides (30, 38) with a rectangular cross-section oriented in the wave propagation direction and located on either side of the plasma enclosure, a horn (36) for coupling one of the guides to the plasma enclosure, whose cross-section widens in the magnetic field direction, the other guide being provided with a short-circuit (46).

11 Claims, 7 Drawing Sheets

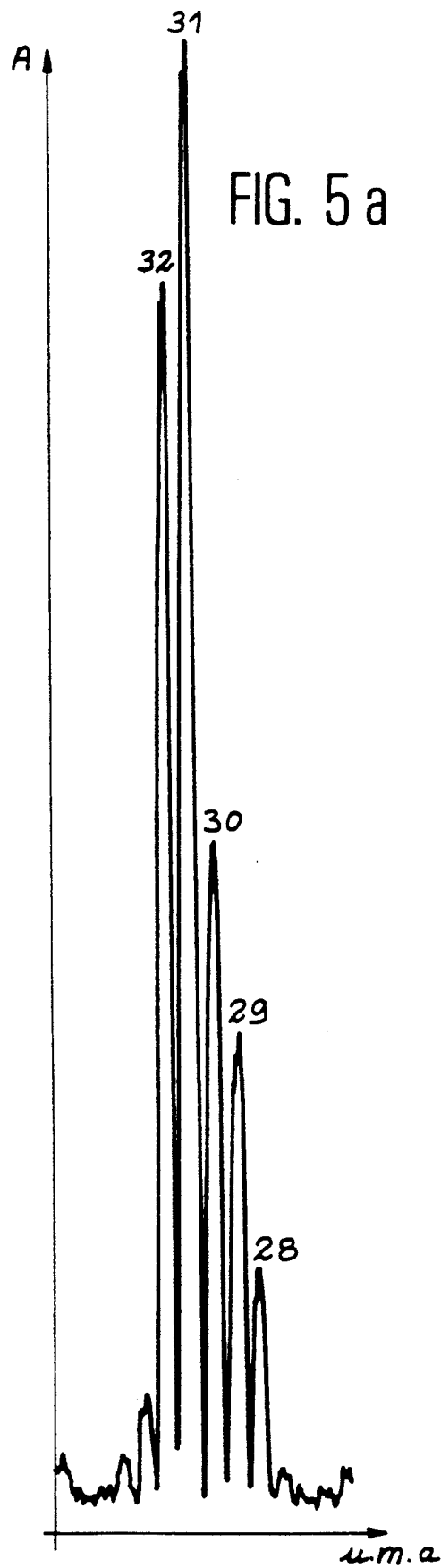
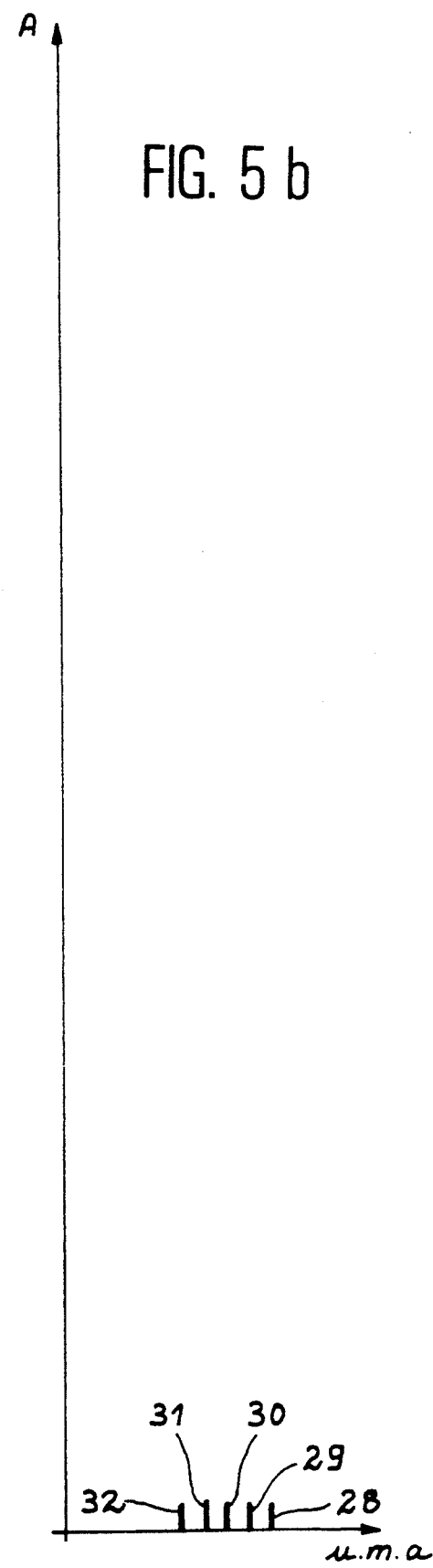

CHEMICAL TREATMENT PLASMA APPARATUS FOR FORMING A RIBBON-LIKE PLASMA

BACKGROUND OF THE INVENTION

The present invention relates to a plasma apparatus for the chemical treatment of samples, to an industrial machine having one or more such apparatuses and to a process using said apparatus.

In particular, the apparatus permits the surface treatment, deposition and chemical etching of thick or thin layers over large sample surfaces at speeds at least 10 or 100 times higher than those obtained with the hitherto known deposition and etching procedures.

It is more particularly used in the microelectronics field for the production of integrated circuits and semiconductor lasers, in the integrated optics field and in the solar field for the photovoltaic conversion of light energy. The integrated circuits to which the invention applies are e.g. circuits for the control of liquid crystal flat-faced screens.

In general, the invention applies to all industrial fields requiring the deposition or etching of thick or thin layers, as well as the chemical cleaning of layers or substrates. These layers and substrates can be dielectrics, metals or semiconductors.

At present there are various etching and deposition apparatus types using a plasma. Generally such apparatuses have a superhigh frequency wave source, a tightly sealed treatment enclosure containing a receiver or a support for supporting the sample to be treated, elements for coupling the superhigh frequency source to the treatment enclosure, gas supplies for forming the plasma and means for pumping the treatment enclosure.

Certain deposition and etching apparatuses also have means for creating a magnetic field in the treatment enclosure, which interacts with superhigh frequency waves in order to ionize the different gases used. These apparatuses make use of the electron cyclotron resonance (ECR) effect. Such an apparatus is more particularly described in "Elongated microwave electron cyclotron resonance heating plasma source" by M. Geisler et al, J. Vac. Sci. Technol., A8 (2), March/April 1990, pp 908-915.

The apparatus according to the invention does not use the magnetic field and therefore the ECR effect. Among non-ECR effect apparatuses, there are plasma assisted chemical vapour deposition apparatuses and machines (PECVD). These machines have been developed for the production of active matrix flat-faced screens and generally use a frequency of 13.56 MHz.

These machines suffer from the disadvantage of using low electron density plasmas not making it possible to obtain a total dissociation of the gases. In order to avoid the diffusion of a non-dissociated gas towards the different deposition plasmas, each plasma is isolated in a vacuum chamber dedicated to the deposition to take place. Each vacuum chamber is equipped with a pumping unit making it possible to obtain a vacuum of approximately $10^{-4}$ Pa and which is usually of the turbomolecular type.

These deposition machines are of a complex nature and are very expensive (10 to 20 million French francs).

Moreover, the complexity of such equipment involves regular maintenance, which significantly reduces the machine availability time. Finally, these machines are generally very large and take up large surface areas in white room-type zones, so that their application is limited.

Another known non-ECR effect apparatus is described in EP-A-398 832. Although this treatment apparatus is less cumbersome than PECVD machines, it still suffers from a certain number of disadvantages. In particular, its construction is complex, so that its manufacturing costs are high. Moreover, due in particular to the plasma forming gas injection mode, it does not make it possible to obtain etching or deposition effects on large surfaces (exceeding 1 $dm^2$) in a homogeneous manner.

SUMMARY OF THE INVENTION

The present invention relates to a novel chemical treatment plasma apparatus and machine and to a process using said apparatus obviating the aforementioned disadvantages. In particular, it permits the homogeneous deposition and etching in chemical manner of thin layers or films over surfaces of approximately 1 $m^2$ and at speeds 10 to 100 times higher than those used up to now.

Moreover, said apparatus is much simpler than the plasma apparatuses without a ECR effect referred to hereinbefore and is therefore less expensive. It permits the mass production at low cost of integrated circuits both in the optical and electronics fields.

More specifically, the invention relates to a chemical treatment plasma apparatus having a high frequency electromagnetic wave source, a sealed plasma enclosure equipped with gas supply means for forming the plasma, elements for coupling the source to the plasma enclosure, means for pumping the plasma enclosure and at least one sample holder, characterized in that the plasma enclosure is of a non-radiating nature and is shaped like a rectangular parallelepiped with a first and second dielectric material faces parallel to a first direction and a third face provided with a rectangular opening oriented in the first direction in order to form a ribbon-like plasma, said opening linking the plasma enclosure and a treatment enclosure in which is housed the sample holder, in that the coupling means have a first rectangular linear waveguide oriented in a second direction perpendicular to the first and second faces, a horn for coupling the first guide to the plasma enclosure via the first face and whose rectangular cross-section widens in the first direction of the first guide towards the plasma enclosure, a second rectangular linear waveguide oriented in the second direction and located on the side of the plasma enclosure opposite to that of the first guide, said second guide being provided with a short-circuit for said electromagnetic waves.

Apart from the advantages referred to hereinbefore it makes it possible to obtain high deposition speeds without the ECR effect, creates high electron density plasmas which are able to dissociate all the molecular gas used for forming the plasma. The frequencies used are generally between 100 MHz and 10 GHz and the superhigh frequency power used can extend up to several kilowatts.

The plasma supplied by the apparatus or reactor according to the invention is very stable. Moreover, the apparatus according to the invention makes it possible to treat several samples in cascade form. In this case mechanical means are provided for successively passing the samples to be treated in front of the rectangular opening of the plasma enclosure parallel to the second direction.

The apparatus according to the invention also permits the simultaneous treatment of several samples. It is in particular possible to treat two samples simultaneously using the same gas plasma. For this purpose the plasma enclosure has another rectangular opening oriented in the first direction and formed in a fourth face of the plasma enclosure, which is parallel to the third face linking the plasma enclosure and the treatment enclosure and another sample holder located in another treatment enclosure is located in front of said other opening.

Advantageously, the short-circuit of the second waveguide is of the piston type, which makes it possible to establish a coupling of the plasma enclosure eliminating any electromagnetic radiation from the enclosure towards its exterior. All the microwave energy is thus maintained within the plasma enclosure. To improve this coupling, it is possible to use impedance adjustment or matching screws which penetrate the first waveguide.

In order to obtain a homogeneous treatment, e.g. a homogeneous deposition or etching over a large surface area, it is preferable for the gas supply means to be constituted by at least one tube having openings over its entire length and issuing into the plasma enclosure, said tube or tubes being oriented parallel to the first direction. In particular, said tube or tubes are located in the vicinity of the rectangular opening of the plasma enclosure.

As a function of the envisaged application, the treatment apparatus can comprise means for heating the sample holder or holders, means for cooling the sample holders and/or means for polarizing the sample holders.

The industrial apparatus according to the invention has small dimensions (length<1 m) compared with those of the prior art apparatuses, so that it can be used in confined areas which, hitherto, could not be equipped with such an apparatus.

The apparatus according to the invention can be used for the chemical deposition of a thick or thin layer on a substrate and the deposited layer can have a thickness of >10 $\mu$m. In this case, the substrate is placed in the treatment enclosure on the sample holder and is exposed to a precursor plasma of the layer to be deposited, produced in the plasma enclosure.

It is also possible to carry out the chemical etching of materials. In this case, the material to be etched is placed in the treatment enclosure on the sample holder and exposed to a chemical etching plasma specific to the material to be etched.

Apart from the advantages referred to hereinbefore, between each treatment, the apparatus according to the invention allows the cleaning thereof.

In a film production line, at present it is accepted that the time required for cleaning the plasma and deposition enclosures can represent 10 to 20% of the machine use time. This cleaning generally takes place by mechanically brushing all the "metallized parts".

It is therefore appropriate to carry out such a cleaning without dismantling the machine, but whilst creating within the treatment apparatus a suitable plasma making it possible to chemically etch the deposits covering the walls of the enclosures until they are exposed. The principle is in fact known and is used by certain 13.56 MHz PECVD plasma reactor manufacturers. Reference is e.g. made to the ND 400 equipment of NEXTRAL.

In the apparatus according to the invention, it is advantageously possible to carry out such a cleaning with a rare gas and halide plasma excited to 2.45 GHz.

After each deposition stage, it is therefore possible to produce a reactor cleaning plasma. This plasma also has the effect of significantly reducing the particular contamination of the reactor, whilst increasing the reactor use efficiency.

The relative position in the plasma enclosure of the perforated tube or tubes can be adjusted. In particular, it is pointed out that the uniformity of the action of the plasma on the substrate is significantly influenced by the position of the tubes for injecting gas into the plasma enclosure, but also by its shape.

Neither the shape, nor the position of the tubes for injecting gas into the plasma enclosure affect the electromagnetic coupling quality of said enclosure. In fact, the diffusion length of the species created in the plasma is sensitive to the injection mode of the gases into the plasma enclosure. This leads to a varying action efficiency and homogeneity of the plasma ribbon or bar.

The apparatus according to the invention can be advantageously used in an industrial machine for the very efficient production of deposits and etchings of fills.

The invention also relates to an industrial machine having one or more apparatuses according to the invention. In particular, said industrial machine can be equipped with the same vacuum or treatment chamber and several plasma apparatuses operating at the same time, at the same pressure, but each being supplied with gases corresponding to the nature of the material to be treated, the sample holders of each apparatus being located in said common vacuum chamber.

BRIEF DESCRIPTION OF THE DRAWING FIGURES

The invention is described in greater detail hereinafter relative to non-limitative embodiments and the attached drawings, wherein show:

FIG. 1 A general, perspective view, in part sectional form of a plasma apparatus according to the invention.

FIG. 2 A more detailed view of FIG. 1 showing in longitudinally sectioned perspective, the vacuum enclosure and the horn of the plasma apparatus.

FIG. 3 A perspective view of a variant of the apparatus of FIG. 1 showing the simultaneous treatment of two samples.

FIG. 4 Diagrammatically and in plan view an industrial machine having three assembled plasma apparatuses according to the invention.

FIGS. 5a and 5b Spectra in atomic mass units (amu) of a SiH$_4$ plasma obtained with the apparatus according to the invention.

FIGS. 6a to 6c Relative to the deposition of hydrogenated silicon nitride using the apparatus according to the invention, FIG. 6a showing the structure of the studied sample, FIG. 6b the electrical measurement arrangement and FIG. 6c the current-voltage characteristic of the structure of FIG. 6a.

FIG. 7 An infrared transmittance spectrum of a hydrogenated amorphous silicon film deposited with the apparatus according to the invention.

FIGS. 8a, 8b and 9a, 9b Relative to thin film transistors produced with the apparatus according to the invention, FIGS. 8a and 9a giving the structures of the transistors produced and FIGS. 8b and 9b the drain current-drain voltage characteristics of said transistors.

DETAILED DESCRIPTION OF THE PREFERRED EMBODIMENT

Figure 1:
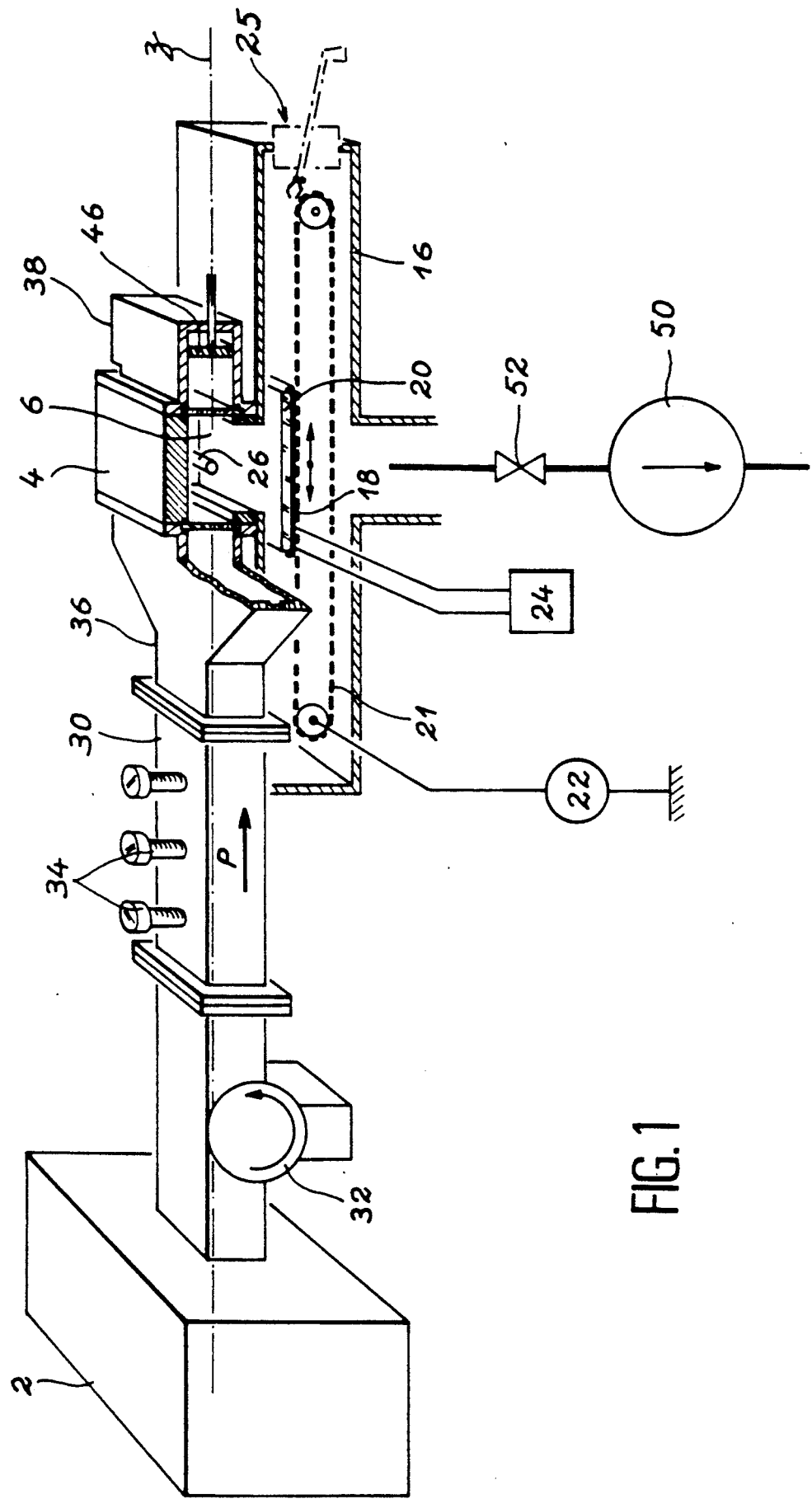
Figure 2:
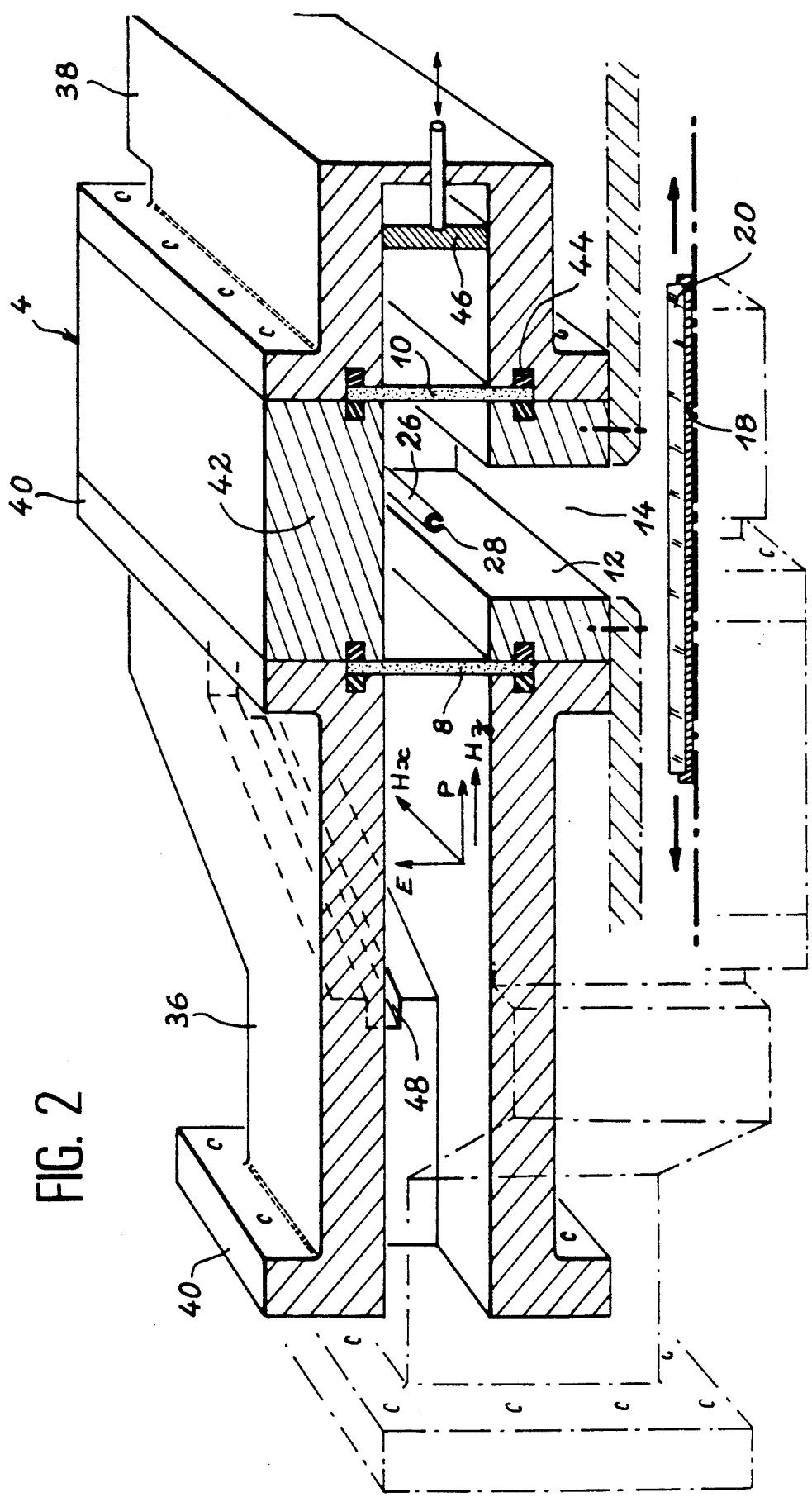

With reference to FIGS. 1 and 2 a description will now be given of the treatment apparatus according to the invention, in a first embodiment.

The apparatus is in fact a plasma reactor incorporating a high frequency electromagnetic wave source 2 coupled to a plasma enclosure 4. The source 2 can supply a power of up to 2 kW at an industrial frequency chosen in the range 100 MHz to 10 GHz (e.g. 433 MHz, 915 MHz, 2.45 GHz, 5.8 GHz, 24 GHz). In particular, the frequency used is 2.45 GHz which, as the most commonly used frequency, is that representing the lowest cost.

The electromagnetic wave from said source propagates in accordance with a transverse electric mode of type $TE_{N0}$ with N uneven. The propagation direction $\vec{P}$ is parallel to the longitudinal axis z of the reactor. The electrical component $\vec{E}$ of this field is oriented perpendicular to the direction $\vec{P}$ in a direction oriented parallel to the section plane of FIG. 2. The magnetic field $\vec{H}$ of the electromagnetic wave has two components $\vec{H}hd x$ and $\vec{H}_z$ perpendicular to one another and located in the plane perpendicular to the direction of the electric field with $\vec{H}_z$ parallel to the direction $\vec{P}$. In particular, the electromagnetic wave propagates according to the fundamental mode $TE_{10}$.

The plasma enclosure 4 defines a plasma chamber 6 shaped like a rectangular parallelepiped. It has two side walls 8, 10 parallel to the direction of the component $\vec{H}_x$ of the magnetic field (or perpendicular to the propagation direction) and made from a material with a low dielectric loss such as silica. The other walls of the plasma enclosure 4 are made from metal, particularly aluminium.

The lower wall 12 of the plasma enclosure, perpendicular to the dielectric walls 8 and 10 has a rectangular opening 14, whose large side is parallel to the dielectric walls 8 and 10. It links the plasma enclosure 4 with a treatment enclosure 16 housing a sample holder 18. The latter moves in the electromagnetic wave propagation direction $\vec{P}$, so that the surface of the sample 20 to be treated supported by the sample holder 18 moves in front of the opening 14 of the plasma enclosure and in parallel. The displacement system of the sample holder 18 can be of the conveyor type, like those conventionally used in microelectronics, e.g. those sold by LEYBOLD under the reference ZW800 (cf. FIG. 3).

This known sample holder 18 can be polarized with the aid of a voltage source 22 connected to the conveyor 21. In the same way, it can be heated with the aid of systems of the electrical resistance type supplied with current by a voltage source 24, or can be cooled with the aid of a fluid circulation system. The arrangement of the heating or cooling system for the sample holder is in accordance with the prior art.

For the introduction of the sample 20 to be treated into the treatment enclosure 16, the latter is equipped at one of its ends with a known system 25 of the introduction lock type.

The plasma enclosure 4 shown in FIG. 2 has a tube 26 oriented parallel to the walls 8 and 10 for the injection of gases to be ionized into the plasma chamber 6. This tube 26 has holes 28 formed along one of its generatrixes, oriented towards the opening 14 of the plasma enclosure and therefore towards the treatment enclosure 16.

This tube 26 is made from small section metal (typically 10 mm$^2$) and the holes 28 have different diameters. Its longitudinal position with respect to the walls 8 and 10 is fixed. However, its height position with respect to the opening 14 can be adjusted. Mechanical means for regulating the height position of the tube 26 are therefore provided outside the reactor and are not shown.

Thus, it is possible to move the gas injection tube very close to the sample 20, e.g. to a distance below 20 mm, thus permitting a homogeneous deposition of thick or thin films or layers on the sample to be treated or the etching of said sample.

The prior art apparatuses and in particular that of EP-398 832 do not permit the injection of the plasma precursor gas as close to the sample to be treated and therefore the homogeneous deposition or etching over large dimensions ($\geq 1$ m$^2$).

The elements for coupling the plasma enclosure 4 to the superhigh frequency source 2 incorporate (FIG. 1) a first straight waveguide 30 with a rectangular section oriented in the propagation direction $\vec{P}$ of the waves, coupled to the source 2 by means of a circulator-isolator 32 protecting the source against any reflections of the superhigh frequency waves created within the reactor. This isolator is not indispensable to the satisfactory operation of the apparatus.

The first waveguide 30 is provided with e.g. 3 adapting screws 34, which penetrate the guide and which make it possible to adapt or match the impedance of the reactor with a view to obtaining a good efficiency of the transmission of the waves towards the plasma enclosure 4.

The coupling of the waveguide 30 of the plasma enclosure 4 takes place by means of a horn 36, whose cross-section progressively widens in accordance with the direction perpendicular to the propagation direction $\vec{P}$ (or parallel to the direction $\vec{H}_x$) until it reaches a rectangular cross-section equal to that of the side walls 8, 10 of the plasma enclosure 4.

The coupling of the horn and the plasma enclosure 4 takes place via the dielectric wall 8. On the opposite side there is a second straight wave-guide 38, whose cross-section is equal to that of the wall of the plasma enclosure 4 facing it. The coupling between the plasma enclosure 4 and the second guide 38 is ensured via the dielectric wall 10.

The dielectric walls 8 and 10 are fixed by integrated clip systems 40 respectively to the upper and lower walls 42, 12 of the plasma enclosure, to the horn 36 and to the waveguide 38.

The vacuum sealing of the plasma chamber 6 is ensured by flexible metallic O-rings 44, e.g. of aluminium.

The terminal guide 38 is in short-circuit connection to the electromagnetic waves and advantageously comprises a piston 46 able to move in the wave propagation direction $\vec{P}$. The displacement system of the piston (not shown can be of the hydraulic or pneumatic type).

The adjustment of the penetrating screws 34 and the position of the piston 46 makes it possible to establish a coupling of the non-radiating plasma enclosure, thus eliminating any electromagnetic radiation from the enclosure to the outside.

The flexible metallic O-rings 44 and the piston 46 serve as short-circuits, which are effective with respect to any electromagnetic radiation from the enclosure to the outside. Thus, all the electromagnetic power is kept within the plasma enclosure and therefore used for plasma formation purposes.

The inner wall of the horn 36 has U-profile roughnesses 48, whose branches are parallel to the direction of the magnetic field $\vec{H}_x$, making it possible to correct any error on the phase of the electric field.

For example, these roughnesses 48 have a depth of $\lambda/4$ and a height of $\lambda/10$. They make it possible to supply the most uniform electromagnetic energy density within the plasma enclosure.

The dimensions of the waveguide, the horn and the plasma enclosure are a function of the frequency of the waves used. For a frequency of 2.45 GHz, the wave length is 12.2 cm.

The complete apparatus has a relatively limited length and which is in all cases below 1 m.

As for the plasma enclosure 4, the assembly of the isolator 32, the waveguide 30 and the horn 36 is ensured by clip systems.

The reactor described hereinbefore makes it possible to create a plasma and produce the seine in the form of a line or bar, by means of an opening 14, directed towards the treatment enclosure 16. The latter is a vacuum enclosure connected to a pumping system 50. A laminar flow valve 52 interposed between the vacuum enclosure 16 and the pumping unit 50 makes it possible to create a variable conductance between the pumping unit and the plasma reactor. It makes it possible to adjust the pressure of the plasma in the plasma enclosure, whilst maintaining an optimum pumping speed of the pumping unit 50.

The operating ranges of the reactor of FIGS. 1 and 2 are those obtained when the reactor is connected to a vacuum unit constituted by a 63 Mh primary pump and a 700 l/s oil spraying pump. In this case, the internal volumes of the plasma chamber 4 and the treatment enclosure 16 are respectively close to 2 l and 30 l.

Figure 3:
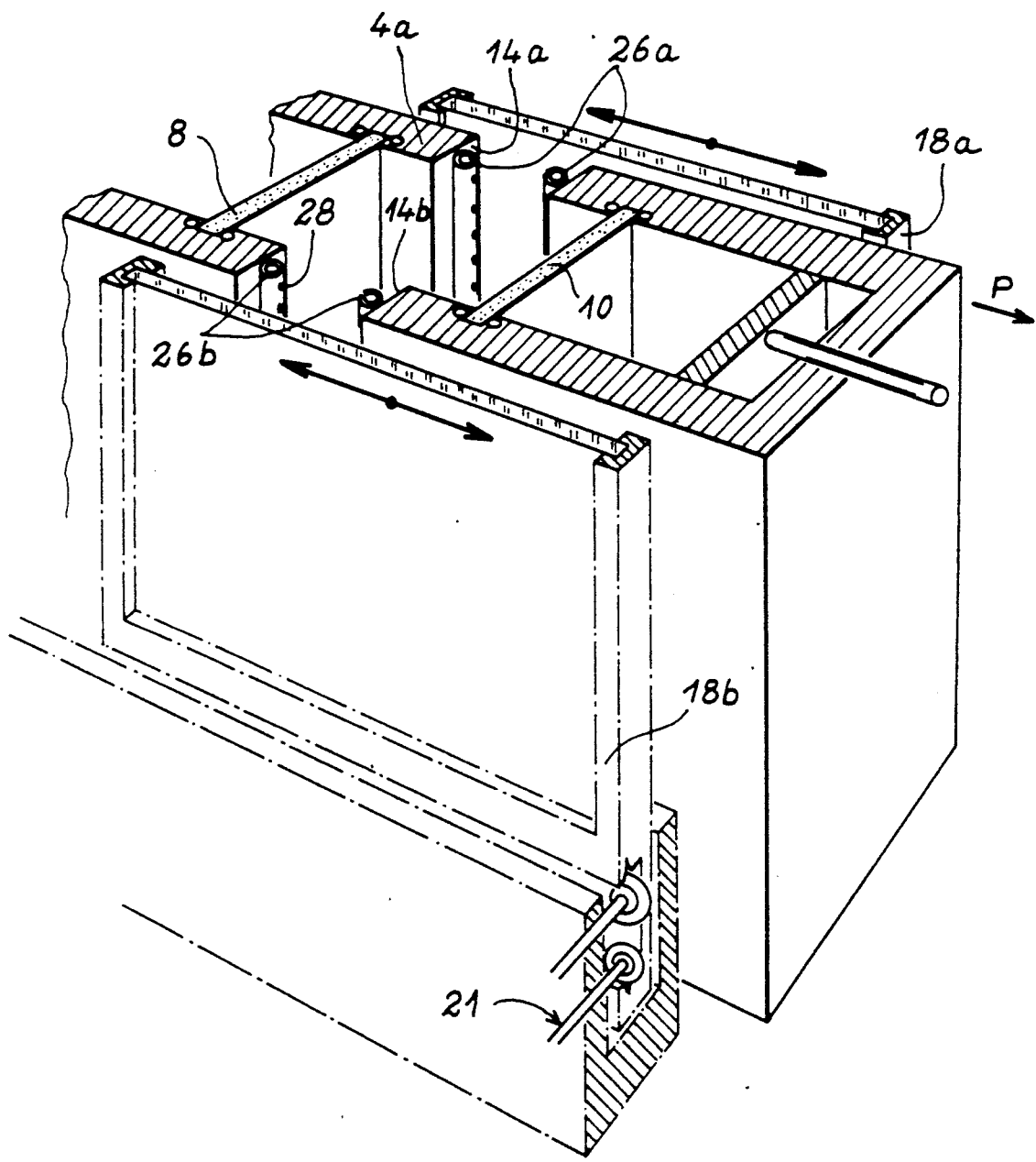

With the treatment apparatus according to the invention, it is possible to simultaneously treat two samples with the same plasma enclosure instead of one, as shown in FIG. 3. In this case, the plasma enclosure 4a has two rectangular lateral openings 14a, 14b, which face one another and are oriented perpendicular to the dielectric walls 8, 10 and in accordance with the field $\vec{E}$.

Facing each of these lateral openings 14a, 14b, there is a sample holder 18a, 18b moving in the propagation direction $\vec{P}$ of the electromagnetic waves.

In this case, the plasma enclosure 4a has two groups of gas injection tubes, a first group 26a positioned facing the opening 14a and a second group 26b positioned facing the opening 14b.

In the embodiment shown in FIG. 3, use is made of two injection tubes for each sample. However, it is possible to use a single injection tube for each sample, as shown in FIG. 1. Conversely, it possible to use in the apparatus according to FIG. 1 two gas injection tubes. In the case when two gas injection tubes per sample are used, the holes 28 in said tubes are no longer oriented towards the sample to be treated, but instead towards the centre of the plasma enclosure 4a. In other words, the holes 28 of the same pair of tubes face one another.

FIG. 3 shows in greater detail the displacement system 21 of the sample holder 18 b.

Figure 4:
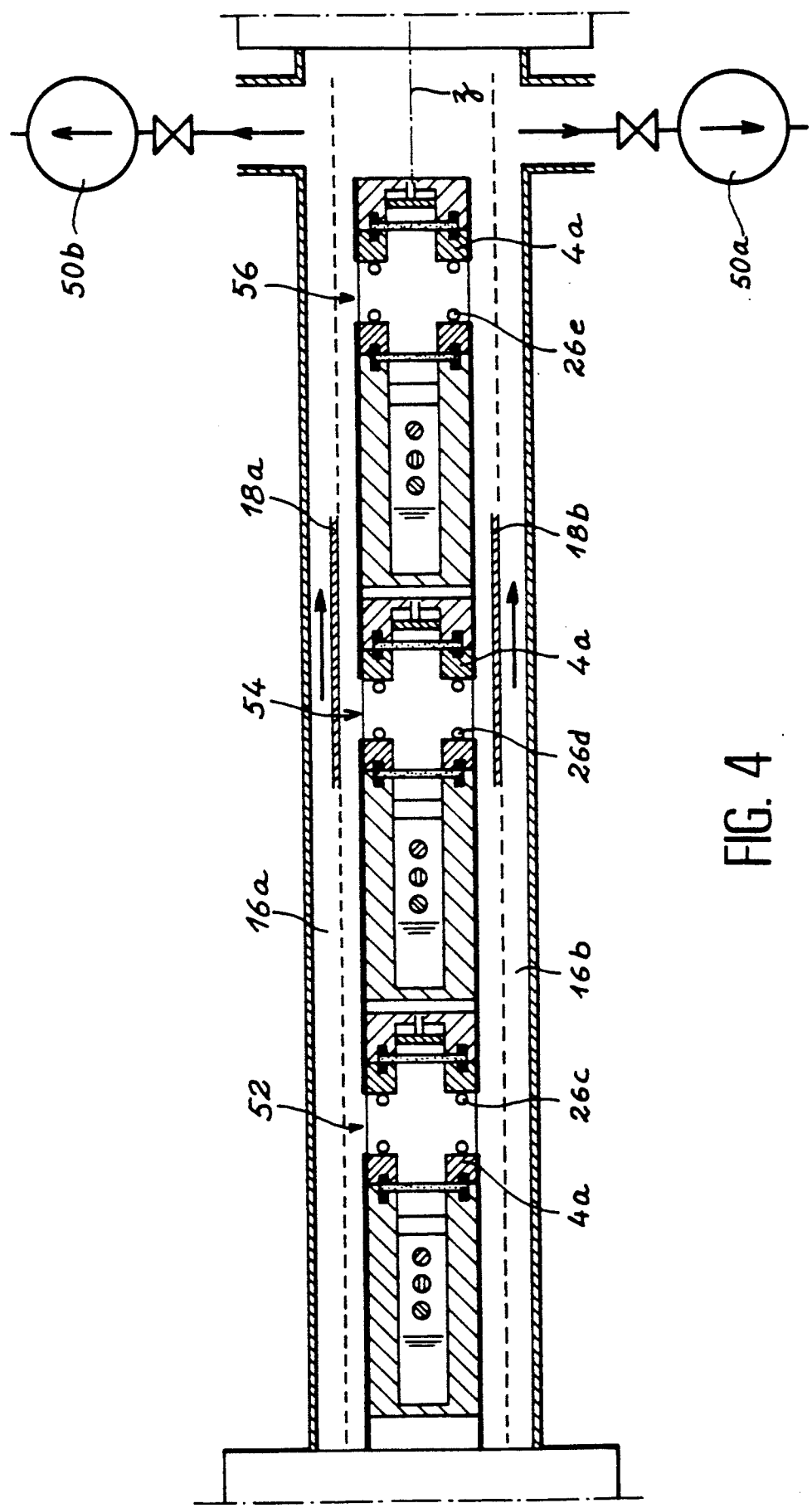

When using two samples on either side of the plasma enclosure 4a, use is not made of a single treatment enclosure as in FIG. 1, but of two treatment enclosures 16a, 16b on either side of the plasma enclosure 4a. This is clearly shown in FIG. 4 representing an industrial machine permitting the simultaneous treatment of several samples. In particular, the machine shown in FIG. 4 is an industrial machine especially developed for producing arrays of flat-faced screens according to the process described in FR-A-2 533 072.

In this case, the treatment machine has three reactors 52, 54, 56 located in linear manner making it possible to treat two samples respectively placed on the vertically positioned, mobile sample holders 18a, 18b. The reactors 52, 54 and 56 are supplied with different gases so as to successively deposit different layers on the two samples.

For example, it is possible to successively deposit on a glass substrate a $n^+$ doped hydrogenated amorphous silicon layer (a-Si:H), then an undoped or intrinsic a-Si:H layer and finally a $Si_3N_4$ layer. In this case, the tubes 26c of the reactor 52 are supplied with $SiH_4$ and $PH_3$, the tubes 26d of the reactor 54 are supplied with $SiH_4$ and the tubes 26e of the reactor 56 are supplied with $SiH_4+NH_3$.

FIG. 4 is a plan view at the plasma enclosures. For each reactor there is clearly a superhigh frequency wave source, a microwave isolator, a horn and waveguides, whereof one is equipped with a piston in order to ensure the coupling of each plasma enclosure with the corresponding source.

The plasma chambers and the elements for coupling the latter with the sources are all aligned in accordance with the machine axis z. The super-high frequency sources can be positioned below and connected to the linear guides with the aid of bent guides in order to reduce the longitudinal dimensions of the machine.

For the deposition of a-Si:H and $Si_3N_4$ layers, the dissociation of the gases mainly leads to the formation of atomic or molecular nitrogen and hydrogen. With a view to avoiding any backscattering of the nitrogen towards the reactors 52, 54 for the deposition of amorphous silicon and which could lead to a deterioration of the quality of said deposit, the connection of the pumping systems of the treatment enclosures 16a, 16b takes place at the silicon nitride deposition reactor 56.

Therefore each treatment enclosure 16a, 16b is connected to a vacuum pump 50a, 50b on either side of the treatment enclosures.

The pumping units are e.g. of the ROOTS type able to absorb the large gas flow in the displacement direction of the sample holders 18a, 18b. It is clearly possible to use only one pump connected to perfectly symmetrical ducts connected to the enclosures 16a, 16b.

The machine shown in FIG. 4 is compact and can be connected to standard modules making it possible to charge samples on the sample holders, as well as heat the samples prior to their placing in the treatment enclosures.

This machine makes it possible to produce active matrixes of flat-faced screens of large dimensions, typically 1 $m^2$, at deposition and etching speeds for the different layers or films 10 to 100 times higher than in the prior art.

The reactors and machines described relative to FIGS. 1 to 4 can be used both for the deposition of thick or thin layers and for the etching of the latter. The nature of the gases used for the formation of the plasmas is consequently dependent on the type of treatment to be carried out.

Plasmas, in a wide pressure and flow rate range are obtained with neutral gases such as argon and helium, but also with the pure gases conventionally used in microelectronics such as $SiH_4$, $PH_3$, $N_2$, $H_2$, $SF_6$, $NH_3$, $O_2$, etc. Air plasmas can also be created in the same pressure and flow rate ranges.

The gas flows used are between 10 and 100 cm$^3$/min. The use of much higher flow rates can be envisaged by increasing the pumping capacity of the vacuum unit or units and in particular by using a ROOTS-type pumping system. In particular, rates of 500 cm$^3$/min can be envisaged.

Stable plasmas can be envisaged with the reactors and machine according to the invention in a pressure range between 1 and 30 Pa. This pressure range is also a function of the pumping unit used.

Under these gas flow and pressure conditions, the residence time of the gaseous species in each plasma reactor is between 0.1 and 60 seconds.

For a plasma enclosure according to FIG. 1 connected to a coupling horn with a section of 100 cm$^2$, the electron density of the plasma was evaluated by Langmuir probe measurements between $10^{11}$ and $10^{13}$ electrons/cm$^2$.

This electron density should be compared with that obtained in the plasmas using the ECR excitation mode and PECVD-type plasmas. The following table gives the electron density (ne) values obtained in the different plasmas. In the table, the plasma according to the invention is designated TWMP for transverse waveguide microwave plasma.

|    | TWMP | ECR | PECVD |
| --- | --- | --- | --- |
| ne | $10^{11}$ to $10^{13}$ | $10^9$ to $10^{11}$ | $10^8$ to $10^9$ |

The very high electron densities obtained with the reactor according to the invention lead, in the case of molecular gases, to high dissociation rates. Residual gas analyzer (AGR) measurements show that for silane (SiH$_4$) plasmas all the gas injected into the plasma enclosure is dissociated.

The spectra recorded on such a plasma are given in FIGS. 5a and 5b, revealing the intensity of the emission peaks A as a function of the atomic mass units. FIG. 5a corresponds to the recording carried out when the silane is introduced into the plasma enclosure prior to initiating the plasma.

The atomic mass peaks 28-29-30-31-32 corresponding to the SiHn radicals (with n=0 to 4) are those introduced into the AGR ionization chamber. This spectrum consequently corresponds to the reference spectrum of the measuring cascade.

FIG. 5b corresponds to the spectrum recorded after initiating the plasma. None of the previously measured peaks is detectable at the sensitivity maximum of the AGR measuring cascade.

It can therefore be concluded that according to a dissociation mechanism of the type SiH$_4$+e→Si+4H+e, all the silane molecules are dissociated and all the thus created atomic silicon is deposited on the substrate and walls of the reactor.

One of the consequences of the very high dissociation rate is to bring about a sudden pressure drop during the initiation of the plasma. For example, for silane, the pressures before and after plasma initiation are virtually in a ratio of two.

For a gas injection system fixed to the interior of the plasma enclosure and a substrate 10 cm from said system, the deposition speeds observed are approximately 2 to 6 nm/s.

More particularly, the deposition speeds obtained for a-Si:H and Si$_3$N$_4$ films are approximately 3 to 4 nm/s, i.e. speeds a good order of magnitude higher than that observed with other deposition methods.

In a reactor according to the invention, the deposition speed is considerably influenced by the flow rate of the injected gas and by the distance between the injection system and the substrate.

Thus, the inventors have demonstrated that in this reactor the dissociation rate of the molecular gases is 100%. Therefore the deposition speed at the substrate is in no way influenced by the gradient of the electron density of the plasma and is only a function of the species created in the plasma.

If the distance between the substrate and the injection system is reduced to 4 cm, then for the same gas flow rate, the deposition speeds are between 6 and 18 nm/s.

The inventors have also demonstrated the possibility of obtaining high etching speeds on thin films such as e.g. a-Si:H or Si$_3$N$_4$ or on photosensitive resin films. Under the action of a pure oxygen plasma (O$_2$), a 1.3 μm thick photosensitive resin film is totally etched in less than 2 minutes.

With no polarization of the substrate, the resin etching speeds obtained are consequently above 10 nm/s and therefore higher than those obtained with the prior art etching devices.

Moreover, the apparatus according to the invention makes it possible, after each etching or deposition of layers or films, to plasma clean the treatment reactors or machines. Thus, a Ar/SF$_6$ plasma makes it possible to obtain etching speeds for the films deposited on the walls at least equal to those obtained for the deposition.

Using the reactor according to the invention, three deposit types were obtained and characterized with a view to producing thin film transistors of an active matrix for liquid crystal flat-faced screens. These materials are silicon nitride, not intentionally doped, hydrogenated amorphous silicon and n+ doped, hydrogenated amorphous silicon.

The main properties of these materials are given hereinafter.

EXAMPLE 1

Deposition of Silicon Nitride

The deposition of thin silicon nitride films is obtained by the decomposition of a mixture of SiH$_4$ and NH$_3$ gases.

The experimental conditions making it possible to obtain a high quality material are a pressure of 2 to 20 Pa, a ratio of the NH$_3$/SiH$_4$ flow rates of 1.5 to 2.5, and a temperature of 100° to 230° C.

As the silicon nitride is used as the transistor gate insulant, it must have good dielectric properties. In particular, the leakage current of the material under a strong electric field must be as low as possible.

Figure 6A:
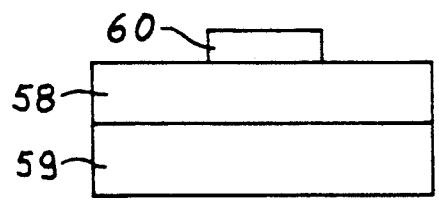

FIG. 6a shows the structure of the studied sample. It has a silicon nitride film 58 deposited on a degenerated monocrystalline silicon wafer 52 used as a conductor substrate and covered with an aluminium electrode 60. The silicon nitride film is 180 nm thick and the aluminium film is 200 nm thick. The surface of the aluminium is 0.3 mm$^2$.

The silicon nitride deposition conditions used for producing the structure of FIG. 6a are a pressure of 2.4 Pa, a SiH$_4$ flow rate of 30 cm$^3$/min, a NH$_3$ flow rate of 50 cm$^3$/min, a power of 800 W, a temperature of 200° C., and a deposition speed of 1.5 nm/s.

Figure 6B:
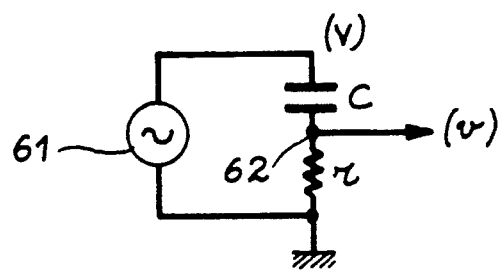

The electric circuit used for testing the structure of FIG. 6a is shown in FIG. 6b and has an alternating electric supply source 61, whose terminals are connected to the capacitor C representing the structure to be measured and to a series-connected resistor r. The measurement of the voltage (v) at the terminals of the resistor r makes it possible to determine the current I flowing through the circuit.

Figure 6C:
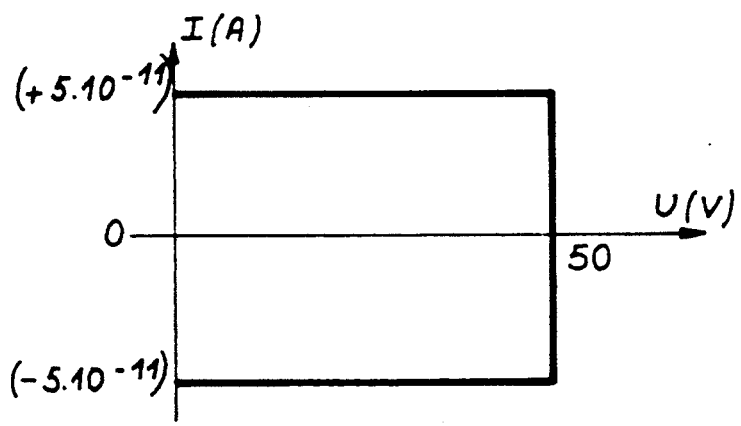

The current-voltage characteristic obtained is shown in FIG. 6c. It gives the variations of the intensity I in amperes as a function of the voltage U in volts. This characteristic only reveals the capacitive component (charging current of the Si$_3$N$_4$ capacitor), which represents a very high resistivity ($\rho > 10^{14}$ ohms/cm) even in a strong field (3 MV/cm) and therefore good insulating properties.

The characterizations carried out demonstrate that the physicochemical properties of Si$_3$N$_4$ deposited by high frequency plasma according to the invention are of the same nature as those obtained for PECVD-deposited films.

EXAMPLE 2

Deposition of Undoped, Hydrogenated Amorphous Silicon

The deposition of a-Si:H hydrogenated amorphous silicon thick or thin films is obtained with the aid of a pure silane plasma under a pressure of 2 to 20 Pa and a temperature of 100° to 230° C. These films can have a thickness of 50 nm to 20 μm, as a function of the envisaged application.

The Expert knows that the semiconductor properties of this material are optimized when the atomic hydrogen concentration is close to 8 to 10%. This hydrogen must be linked with the silicon mainly in the form of Si-H bonds, to the detriment of the other possible bonds H-Si-H and

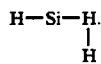

Infrared vibrational spectroscopy is the fastest and most suitable method for such structural studies on a microphysical scale.

Figure 7:
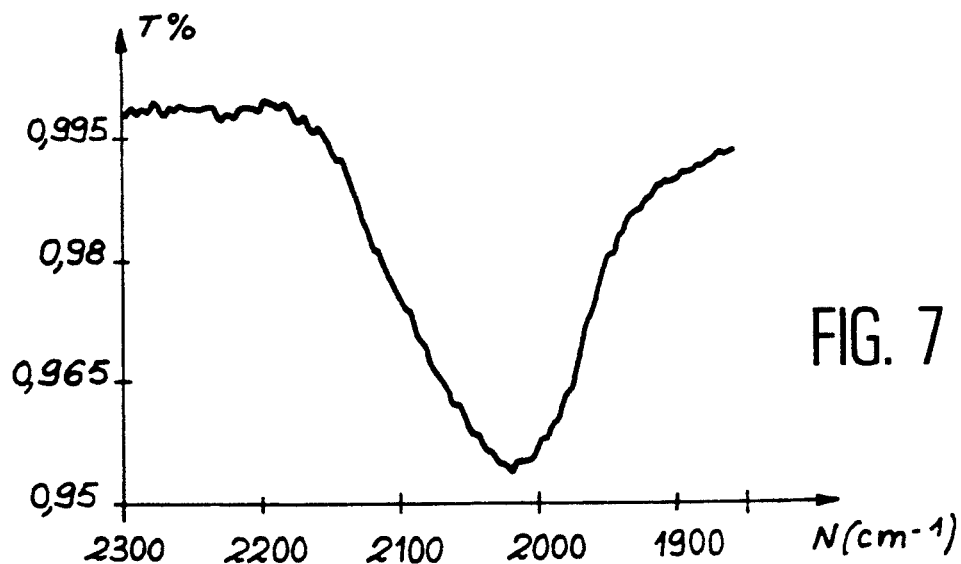

FIG. 7 gives the transmittance (T%) of a a-Si:H film in the range 1900 to 2300 cm$^{-1}$, in which N represents the number of waves. It is possible to see a main band, whose maximum frequency is close to 2000 cm$^{-1}$ corresponding to the Si-H bonds.

The precise study of the profile of this main band reveals a shoulder close to 2100 cm$^{-1}$. This shoulder is attributed to a low intensity band corresponding to the H-Si-H bonds.

The hydrogen concentration calculated on the basis of the total surface of the structure is 7%. It would therefore appear that the material deposited according to the invention has a hydrogen concentration equivalent to that determined in PECVD.

This rapid characterization makes it possible to affirm that the deposited material is a good semiconductor. This is confirmed by the measurement of the electrical characteristics of the transistors produced and by the calculation of the effective mobility of the carries on the basis of an analytical model simulating the operation of these transistors.

EXAMPLE 3

Deposition of Doped, Hydrogenated Amorphous Silicon

Deposition takes place from a mixture of silane and phosphine diluted to 5% in the helium (He-5% PH$_3$).

The experimental conditions are pressure 2 to 20 Pa and temperature 100° to 230° C.

The lateral conductivity (or surface) of the films measured is between $10^{-4}$ and $2 \times 10^{-3}$ ohm$^{-1}$.cm$^{-1}$. These values comparable to those obtained in PECVD make it possible to produce ohmic contacts between the indium and tin oxide (ITO) of the source and drain and the a-Si:H.

EXAMPLES 4 AND 5

Figure 8:
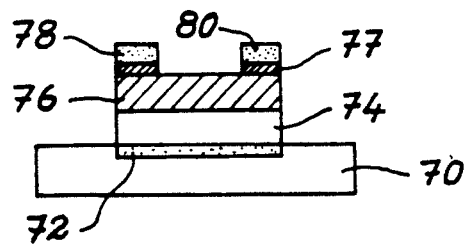
Figure 8:
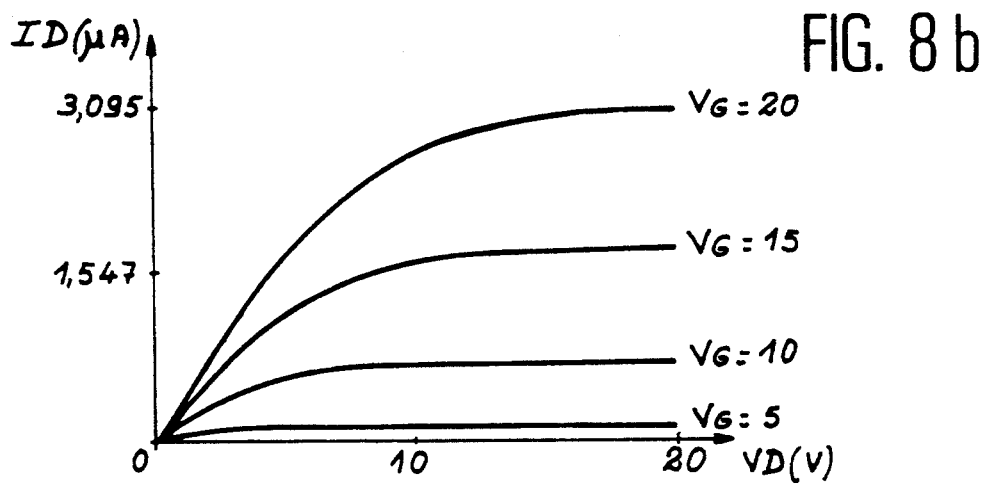
Figure 9:
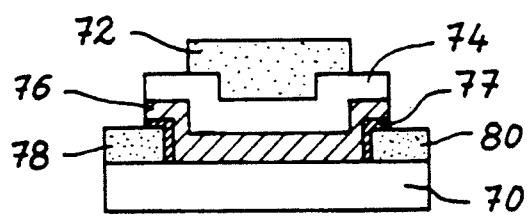
Figure 9:
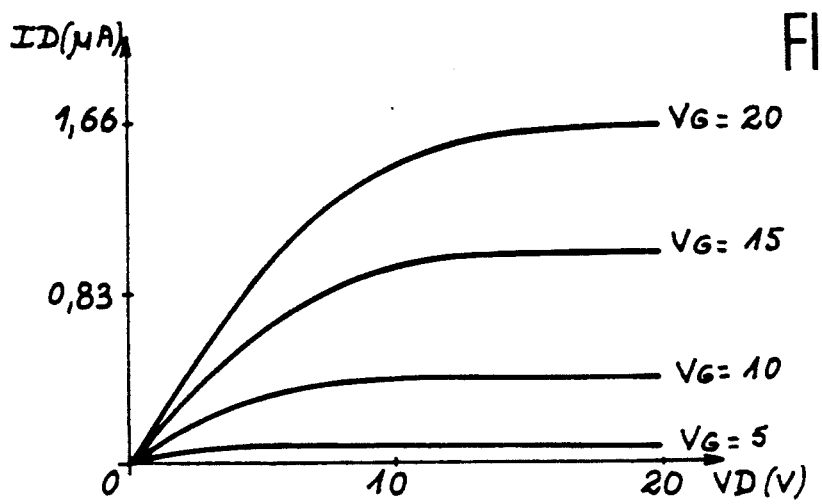

Two thin fill transistor structures were produced one stacked with the gate at the bottom (cf. FIG. 8a) and the second stacked with the gate at the top (cf. FIG. 9a). The (ID)-(VD) characteristics of these transistors are also given in FIGS. 8b and 9b respectively.

The currents ID are given in microamperes and the drain-source voltages VD in volts. A gate voltage VG corresponds to each curve.

The transistor of FIG. 8a has a glass substrate 70 on which is formed the 200 nm thick aluminium, metal gate 72. It is covered with the 300 nm thick silicon nitride gate insulant 74. There is then a 100 nm thick, hydrogenated amorphous silicon fill 76 and a 50 nm thick, n+ doped hydrogenated amorphous silicon fill 77 on which are formed the source 78 and the drain 80 in the indium and tin oxide fill having a thickness of 200 nm. The channel has a length of 40 μm and a width of 10 μm.

The transistor of FIG. 9a also has a glass substrate 70 on which are directly formed the ITO source and drain contacts 78 and 80, which are covered with a n doped, hydrogenated amorphous silicon fill 77. This is followed by the hydrogenated amorphous silicon fill 76, then the gate insulant 74 and finally the metal gate 72. The thicknesses of the fills 78, 77, 76, 74 and 72 are the sane as hereinbefore, whilst the channel a has a width of 40 μm and a length of 10 μm.

The transistor with the gate on top is produced in accordance with FR-A-2 533 072.

The different transistor films deposited, as well as their etching for defining the dimensions of these transistors were carried out with the reactor according to the invention.

The effective mobility of the electrons in the channel of these transistors was calculated by a parameter extraction method based on an analytical operating model of said transistors.

In the case of a transistor with a gate at the bottom, the mobility is 0.5 cm$^2$/V.s.

For comparison purposes, the prior art values for such a structure are typically between 0.3 and 1 cm$^2$/V.s.

The results given here can obviously be improved and it is reasonably possible to estimate that when the optimum manufacturing conditions are achieved, higher mobility values will be obtained. The results given here are those obtained with films deposited at pressures of approximately 1 to 10 Pa.

However, the inventors have noted that films deposited at higher pressures i.e. between 20 and 50 Pa, retain the sought physicochemical properties. Thus, in view of the fact that it is possible to work at high pressure, it is immediately apparent that by using a vacuum pumping system of the reactor accepting high gas flow rates, it is possible to envisage obtaining very high deposition speeds of approximately 10 to 20 nm/s.

The curves in FIGS. 8b and 9b are comparable to those obtained with the prior art PECVD reactors.

Using the apparatus according to the invention, it is also possible to deposit $\geq 10$ μm thick films, particularly of a-Si:H, on a glass substrate (particularly soda-lime glass), in order to obtain light energy conversion devices (or solar cells).

We claim:

1. Chemical treatment plasma apparatus having a high frequency electromagnetic wave source, a sealed plasma enclosure equipped with gas supply means for forming the plasma, means for coupling the source to the plasma enclosure, means for pumping the plasma enclosure and at least one sample holder, wherein the plasma enclosure is of a non-radiating nature and is shaped like a rectangular parallelepiped with first and second dielectric material faces parallel to a first direction and a third face provided with a rectangular opening oriented in the first direction in order to form a ribbon-like plasma, said opening linking the plasma enclosure and a treatment enclosure in which is housed the sample holder, the coupling means comprising a first rectangular linear waveguide oriented in a second direction perpendicular to the first and second faces, a horn for coupling the first guide to the plasma enclosure via the first face and whose rectangular cross-section widens in the first direction from the first guide towards the plasma enclosure, and a second rectangular linear waveguide oriented in the second direction and located on the side of the plasma enclosure opposite to that of the first guide, said second guide being provided with a short-circuit for said electromagnetic waves.

2. Apparatus according to claim 1, wherein the gas supply means comprise at least one tube having holes over its entire length and which issue into the plasma enclosure, said at least one tube being oriented parallel to the first direction.

3. Apparatus according to claim 2, wherein the gas supply means comprise a single tube, whose holes are oriented towards the rectangular opening of the plasma enclosure.

4. Apparatus according to claim 2, wherein the at least one tube is positioned in the vicinity of the rectangular opening of the plasma enclosure.

5. Apparatus according to claim 1, wherein the gas supply means incorporates two tubes oriented in accordance with the first direction, holes in said two tubes being oriented towards the center of the plasma enclosure.

6. Apparatus according to claim 1, wherein the plasma enclosure has a second rectangular opening oriented in accordance with the first direction and formed in a fourth face of the plasma enclosure, parallel to the third face linking the plasma enclosure and the treatment enclosure and wherein another sample holder located in another treatment enclosure is positioned facing said second opening.

7. Apparatus according to claim 1, wherein means for adapting the wavelength emitted by the high frequency wave source are provided in the first waveguide.

8. Apparatus according to claim 1, wherein an isolating circuit is provided between the high frequency wave source and the first waveguide.

9. Apparatus according to claim 1, wherein the first and second faces of the plasma enclosure are mounted with the aid of metal clips respectively on the horn and the second waveguide, sealing at the clips being ensured with the aid of flexible metallic O-rings.

10. Apparatus according to claim 1, wherein means for displacing the sample holder in the first direction are provided.

11. Industrial plasma machine for the chemical treatment of several samples, wherein it incorporates several apparatuses according to claim 1, which follow one another and wherein it comprises at least one treatment enclosure common to these various apparatuses containing the sample holders of the latter.

* * * * *